US009984768B2

United States Patent
Hyun et al.

(10) Patent No.: US 9,984,768 B2
(45) Date of Patent: May 29, 2018

(54) DISTRIBUTING STORAGE OF ECC CODE WORDS

(71) Applicant: SanDisk Technologies, Inc., Plano, TX (US)

(72) Inventors: Jea Hyun, Los Altos, CA (US); James Peterson, San Jose, CA (US); John Strasser, Kaysville, UT (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 269 days.

(21) Appl. No.: 14/601,806

(22) Filed: Jan. 21, 2015

(65) Prior Publication Data

US 2016/0110252 A1 Apr. 21, 2016

Related U.S. Application Data

(60) Provisional application No. 62/066,251, filed on Oct. 20, 2014.

(51) Int. Cl.
  *G06F 11/10* (2006.01)
  *G11C 29/52* (2006.01)
  *G11C 29/04* (2006.01)

(52) U.S. Cl.
  CPC .......... *G11C 29/52* (2013.01); *G06F 11/1044* (2013.01); *G11C 2029/0411* (2013.01)

(58) Field of Classification Search
  CPC .............. G06F 11/1012; G06F 11/1068; G11C 2029/0411
  See application file for complete search history.

(56) References Cited

U.S. PATENT DOCUMENTS

| 7,533,328 | B2 | 5/2009 | Alrod et al. |
| 8,266,496 | B2 | 9/2012 | Flynn et al. |
| 8,392,807 | B2 | 5/2013 | Naradasi et al. |
| 8,533,569 | B2 | 9/2013 | Flynn et al. |
| 8,671,327 | B2 | 3/2014 | Litsyn et al. |
| 8,719,677 | B2 | 5/2014 | Alrod et al. |
| 9,165,938 | B1 * | 10/2015 | Kim ...................... H01L 27/115 |

(Continued)

OTHER PUBLICATIONS

Hruska, Joel, "New Manufacturing Technology Enables Vertical 3D NAND Transistors, Higher Capacity SSDs", ExtremeTech Newsletter, Jun. 27, 2012, pp. 6.

(Continued)

*Primary Examiner* — Kyle Vallecillo
(74) *Attorney, Agent, or Firm* — Kunzler, PC

(57) ABSTRACT

Apparatuses, systems, methods, and computer program products are disclosed for distributing error-correction codes. A correction module is configured to determine an error correction code (ECC) code word for storage on one or more non-volatile storage media. A mapping module is configured to determine one or more addresses for the ECC code word so that a portion of the ECC code word is stored at a first physical address within a first set of strings of storage cells of the one or more non-volatile storage media and a portion of the ECC code word is stored at a different physical address within a second set of strings of storage cells of the one or more non-volatile storage media. A storage module is configured to cause the ECC code word to be stored in the one or more non-volatile storage media based on the determined one or more addresses.

19 Claims, 6 Drawing Sheets

(56) References Cited

U.S. PATENT DOCUMENTS

| | | |
|---|---|---|
| 2012/0023384 A1 | 1/2012 | Naradasi et al. |
| 2012/0278687 A1 | 11/2012 | Sharon et al. |
| 2012/0304039 A1* | 11/2012 | Peterson ................. G06F 11/10 714/773 |
| 2013/0024748 A1 | 1/2013 | Sharon et al. |
| 2013/0138870 A1* | 5/2013 | Yoon ................... G11C 11/5621 711/103 |
| 2013/0145229 A1 | 6/2013 | Frayer et al. |
| 2013/0145231 A1 | 6/2013 | Frayer et al. |
| 2013/0166986 A1 | 6/2013 | Alrod et al. |
| 2014/0082456 A1 | 3/2014 | Liu |
| 2014/0245098 A1 | 8/2014 | Sharon et al. |
| 2015/0074487 A1* | 3/2015 | Patapoutian ........ G06F 11/1012 714/758 |

OTHER PUBLICATIONS

Handy, Jim, "What is 3D NAND? Why Do We Need It? How Do They Make It?", The Memory Guy, Oct. 11, 2013.

\* cited by examiner

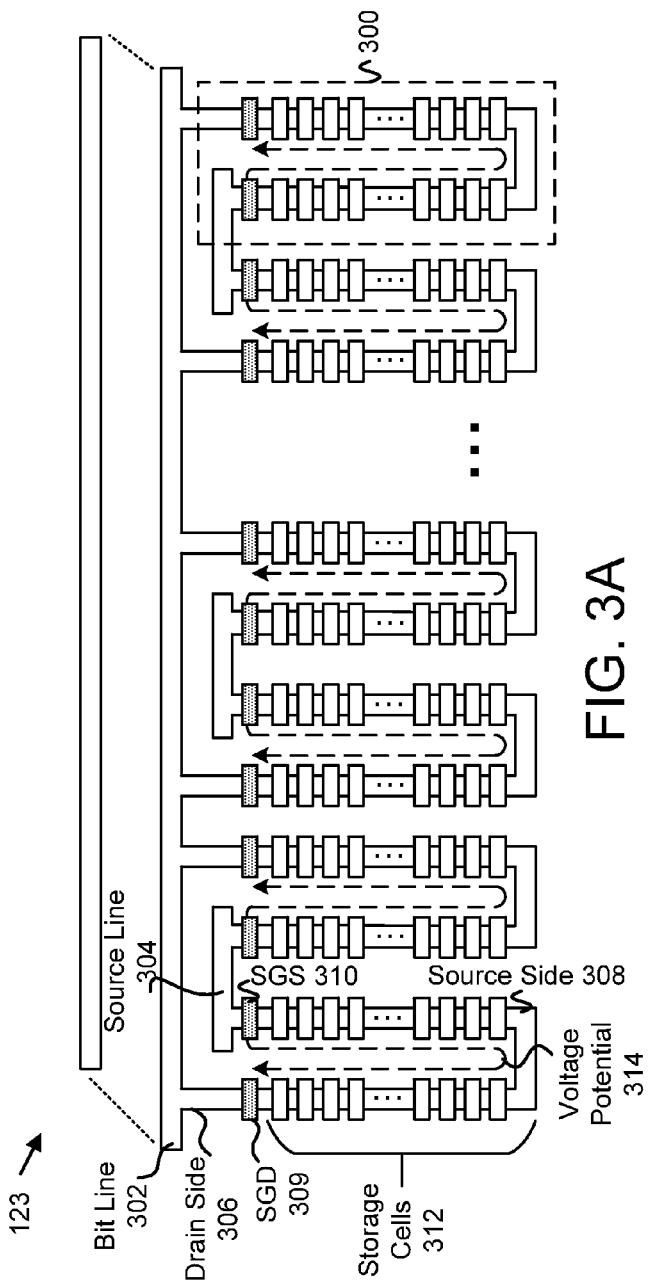
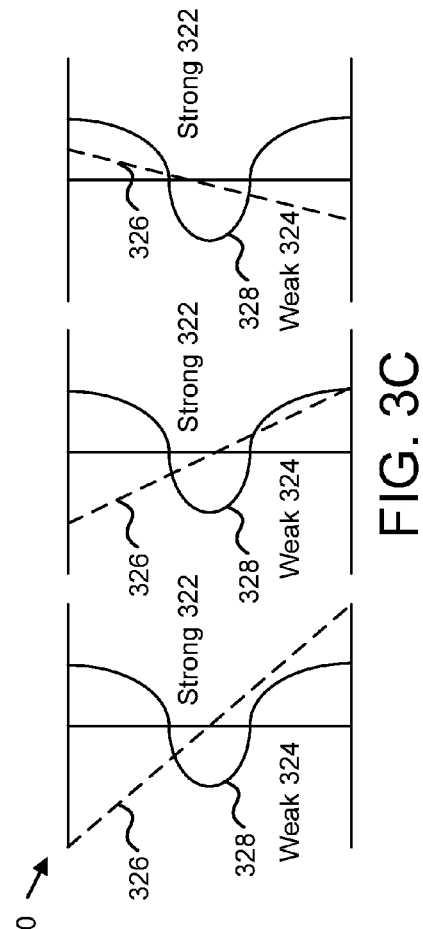
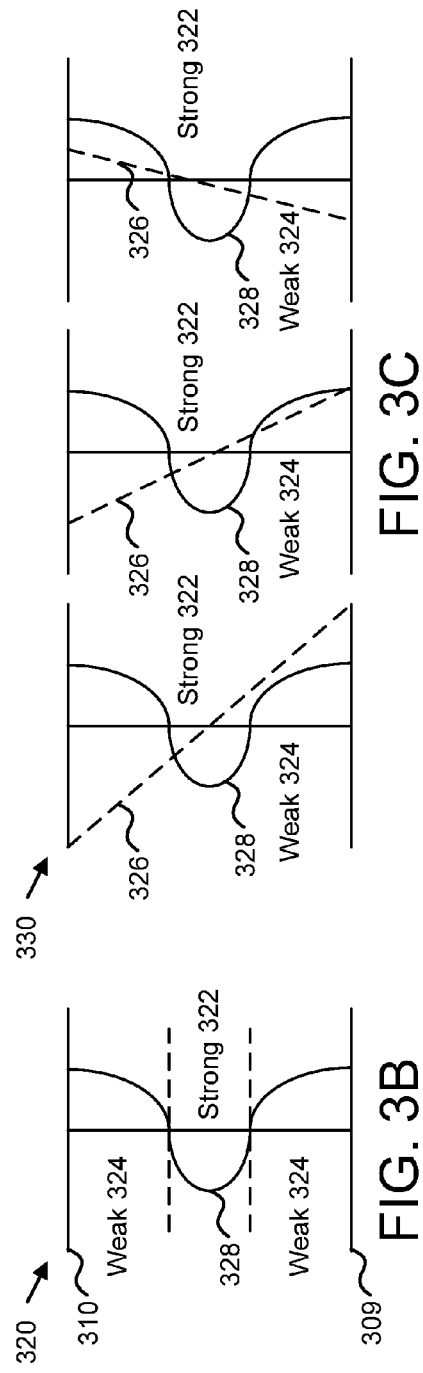

DISTRIBUTING STORAGE OF ECC CODE WORDS

CROSS-REFERENCES TO RELATED APPLICATIONS

This application claims the benefit of U.S. Provisional Patent Application No. 62/066,251 entitled "DISTRIBUTING STORAGE OF ECC CODE WORDS" and filed on Oct. 20, 2014, for Jea Hyun, et al., which is incorporated herein by reference.

TECHNICAL FIELD

The present disclosure, in various embodiments, relates to storing error-correction code (ECC) code words and more particularly relates to distributing storage of ECC code words on non-volatile storage media.

BACKGROUND

Non-volatile storage devices, such as Flash memory devices, have a number of different storage locations or physical addresses at which data may be stored. Different storage locations may have different associated reliabilities or error rates, due to different physical and/or electrical properties of the respective storage locations.

An error-correction code (ECC) may be used to correct errors in stored data, whether the errors are caused by different properties of the different storage locations or otherwise. Accordingly, data may be encoded and stored as ECC code words, so that certain errors in the data may be corrected. However, due to the different reliabilities or error rates of different storage locations, certain ECC code words may have more errors than others, requiring each ECC code word to use a stronger ECC with more redundant data, even for ECC code words stored in more reliable locations with lower error rates. Using a stronger ECC can increase the storage overhead required to store user data, due to redundant data added for the ECC, thereby reducing a storage capacity available to store the user data. Using a stronger ECC can also increase a processing overhead to encode and/or decode the associated data.

SUMMARY

Methods are presented for distributing storage of error-correction code (ECC) code words. In one embodiment, a method includes determining an ECC code word of data. In another embodiment, a method includes storing a first portion of an ECC code word in a first set of cells of a first memory element of a non-volatile recording device. In a further embodiment, a method includes storing a second portion of an ECC code word in a second set of cells of a second memory element of a non-volatile recording device. In some embodiments, a second set of cells has a different error rate than a first set of cells.

Apparatuses are presented to distribute storage of ECC code words. In one embodiment, a correction module is configured to determine an ECC code word for storage on one or more non-volatile storage media. In another embodiment, a mapping module is configured to determine one or more addresses for an ECC code word so that a portion of the ECC code word is stored at a first physical address within a first set of strings of storage cells of one or more non-volatile storage media and a portion of the ECC code word is stored at a different physical address within a second set of strings of storage cells of the one or more non-volatile storage media. In a further embodiment, a storage module is configured to cause an ECC code word to be stored in one or more non-volatile storage media based on a determined one or more physical addresses.

Systems are presented to distribute error-correction codes. In one embodiment, each of a plurality of die comprises vertical NAND flash memory structures comprising word lines. In another embodiment, a controller for a plurality of die is configured to store part of an ECC code word in cells that have a first position in a word line of a first die of a plurality of die and part of the ECC code word in cells that have a second position in a word line of a second die of the plurality of die.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which:

FIG. 3A illustrates one embodiment of a memory element comprising 3D, vertical NAND flash memory structures;

FIG. 3B illustrates a further embodiment of a 3D, vertical NAND flash memory structure;

FIG. 3C illustrates additional embodiments of 3D, vertical NAND flash memory structures;

DETAILED DESCRIPTION

Figure 1:
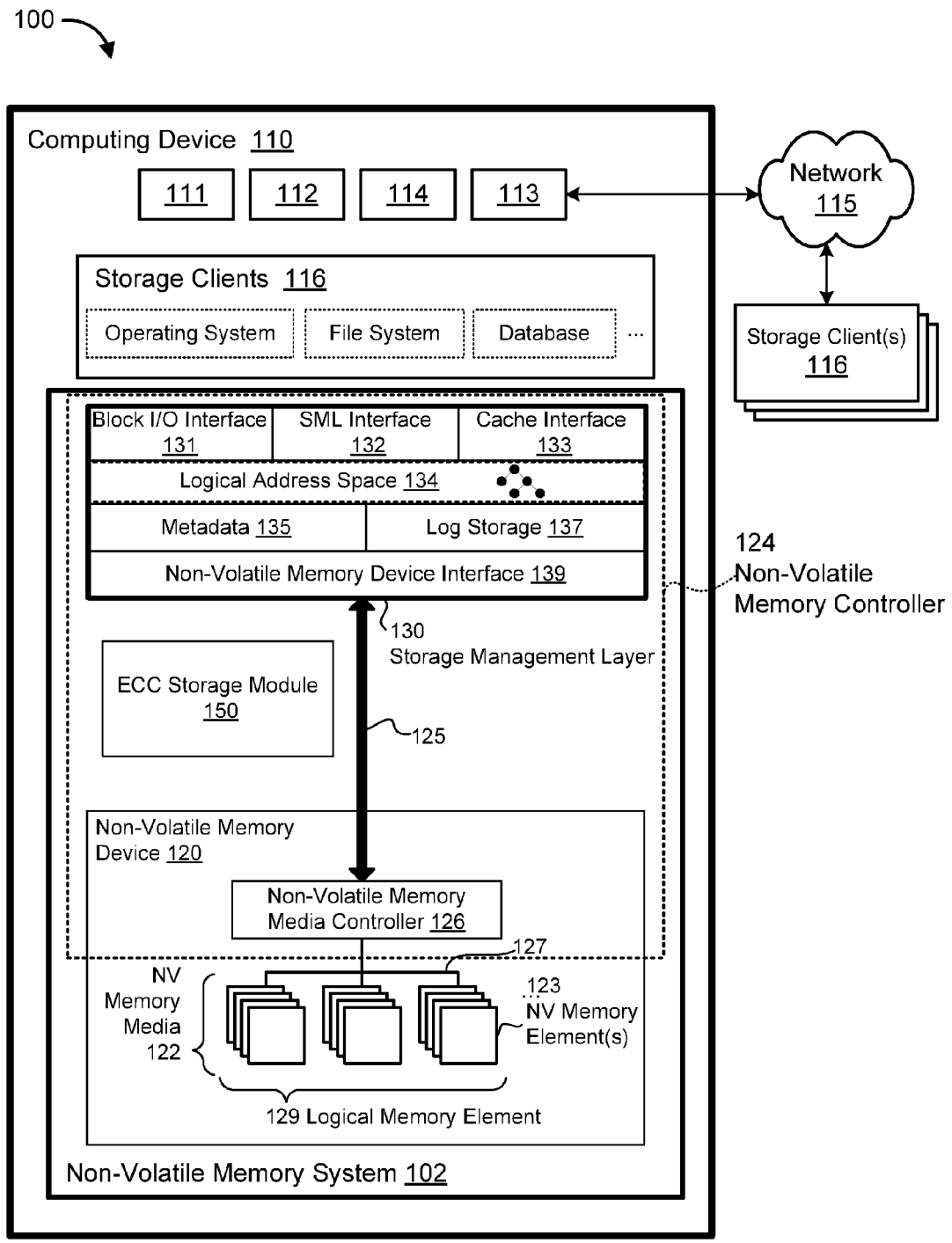
FIG. 1 is a schematic block diagram of one embodiment of a system comprising an ECC storage module.

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "circuit," "module," "apparatus," or "system." Furthermore, aspects of the present disclosure may take the form of a computer program product embodied in one or more non-transitory computer readable storage media storing computer readable and/or executable program code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented at least partially in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may include a single instruction, or many instructions, and may even be distributed over several different code segments, among different programs, across several memory devices, or the like. Where a module or portions of a module are implemented in software, the software portions may be stored on one or more computer readable and/or executable storage media. Any combination of one or more computer readable storage media may be utilized. A computer readable storage medium may include, for example, but not limited to, an electronic, magnetic, optical, electromagnetic, or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object oriented programming language such as Java, Smalltalk, C++, C#, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

FIG. 1 is a block diagram of one embodiment of a system 100 comprising an error-correction code (ECC) storage module 150. The ECC storage module 150 may be part of and/or in communication with one or more of a non-volatile memory controller 124, a non-volatile memory media controller 126, a device driver or storage management layer (SML) 130, or the like. The ECC storage module 150 may operate on a non-volatile memory system 102 of a computing device 110, which may comprise a processor 111, volatile memory 112, and a communication interface 113. The processor 111 may comprise one or more central processing units, one or more general-purpose processors, one or more application-specific processors, one or more virtual processors (e.g., the computing device 110 may be a virtual machine operating within a host), one or more processor cores, or the like. The communication interface 113 may comprise one or more network interfaces configured to communicatively couple the computing device 110 and/or non-volatile memory controller 124 to a communication network 115, such as an Internet Protocol network, a Storage Area Network, or the like.

The computing device 110 may further comprise a non-transitory, computer readable storage media 114. The computer readable storage media 114 may comprise executable instructions configured to cause the computing device 110 (e.g., processor 111) to perform steps of one or more of the methods disclosed herein. Alternatively, or in addition, the ECC storage module 150 may be embodied as one or more computer readable instructions stored on the non-transitory storage media 114.

The non-volatile memory system 102, in the depicted embodiment, includes an ECC storage module 150. The ECC storage module 150, in one embodiment, is configured to distribute storage of an ECC code word among a plurality of memory elements 123. For example, in certain embodiments, the ECC storage module 150 may determine ECC code words of data (e.g., encode data into ECC code words), store a first portion of an ECC code word in a first set of cells of a first memory element 123 of a non-volatile recording device 120, and store a second portion of the ECC code word in a second set of cells of a second memory element 123 of the non-volatile recording device 120. In one embodiment, the second set of cells may have a different error rate than the first set of cells.

In this manner, an error rate, such as a raw bit error rate (RBER), an uncorrectable bit error rate (UBER), or another bit error rate (BER), for ECC code words may be leveled, averaged, and/or amortized over a non-volatile recording media 122 of a non-volatile recording device 120, because a portion of an ECC code word may be stored in a storage location that has a higher reliability (e.g., a lower error rate) and a portion of the ECC code word may be stored in a different storage location that has a lower reliability (e.g., a higher error rate). Otherwise, if one ECC code word was stored in a storage location having a higher reliability and another ECC code word was stored in a storage location having a lower reliability, the ECC code words would have different error rates, requiring stronger or more intensive ECC to correct the higher error rate, or risk data loss.

In certain embodiments, as described below, the non-volatile memory elements 123 of the non-volatile recording media 122 may store data in 3D, vertical NAND flash memory structures. 3D, vertical NAND flash memory cells may comprise a string of cells oriented vertically (e.g., in a "U" or pipe configuration, in an "I" configuration, or the like), in order to increase the density of storage within a non-volatile memory element 123 when compared to traditional (e.g., horizontal) NAND flash memory. However, due to the vertical architecture, the complex silicon fabrication process, and the like, cells within the same string of 3D, vertical NAND flash memory (e.g., the same 3D, vertical NAND flash memory structure) may have different levels of reliability, different error rates, or the like.

Since a word line of storage cells, in certain embodiments, comprises storage cells having the same position or location in a plurality of 3D, vertical NAND flash memory structures or strings, if an ECC code word is written to the same word lines and/or physical addresses of multiple memory elements 123, some ECC code words would be written to word lines having higher error rates while other ECC code words would be written to word lines having lower error rates. The ECC storage module 150, in certain embodiments, adjusts or determines different physical addresses for different portions of an ECC code word, in different memory elements 123 or the like, to even out our amortize error rates. For example, based on locations at which the ECC storage module 150 stores portions of ECC code words, different ECC code words may have the same error rates, substantially similar error rates, error rates within a predetermined range, or the like.

In another embodiment, the ECC storage module 150 may adjust or determine physical addresses for different portions of an ECC code word so that ECC code words with data having a higher priority or quality of service (QoS) level are stored in more storage cells having a higher reliability and/or lower error rate than ECC code words with data having a lower priority or quality of service level. In this manner, different portions of the same ECC code word may be stored in different relative locations or positions within different memory elements 123. In a further embodiment, the ECC storage module 150 stores a larger portion or percentage of an ECC code word in storage cells having a higher reliability and/or lower error rate. In such an embodiment, the ECC storage module 150 may allow certain storage cells having a lower reliability and/or higher error rate to go unused, may rotate which lower reliability and/or higher error rate cells are used to store data, or the like.

In one embodiment, the ECC storage module 150 may comprise executable software code, such as a device driver, SML 130, or the like, stored on the computer readable storage media 114 for execution on the processor 111. In another embodiment, the ECC storage module 150 may comprise logic hardware of one or more non-volatile memory devices 120, such as a non-volatile memory media controller 126, a non-volatile memory controller 124, a device controller, a field-programmable gate array (FPGA) or other programmable logic, firmware for an FPGA or other programmable logic, microcode for execution on a micro-controller, an application-specific integrated circuit (ASIC), or the like. In a further embodiment, the ECC storage module 150 may include a combination of both executable software code and logic hardware.

In one embodiment, the ECC storage module 150 is configured to receive storage requests from the SML 130 via a bus 125 or the like. The ECC storage module 150 may be further configured to transfer data to/from the SML 130 and/or storage clients 116 via the bus 125. Accordingly, the ECC storage module 150, in some embodiments, may comprise and/or be in communication with one or more direct memory access (DMA) modules, remote DMA modules, bus controllers, bridges, buffers, and so on to facilitate the transfer of storage requests and associated data. In another embodiment, the ECC storage module 150 may receive storage requests as an API call from a storage client 116, as an IO-CTL command, or the like. The ECC storage module 150 is described in greater detail below with regard to FIG. 2.

According to various embodiments, a non-volatile memory controller 124 comprising the ECC storage module 150 may manage one or more non-volatile memory devices 120. The non-volatile memory device(s) 120 may comprise recording, memory, and/or storage devices, such as solid-state storage device(s), that are arranged and/or partitioned into a plurality of addressable media storage locations. As used herein, a media storage location refers to any physical unit of memory (e.g., any quantity of physical storage media on a non-volatile memory device 120). Memory units may include, but are not limited to: pages, memory divisions, erase blocks, sectors, blocks, collections or sets of physical storage locations (e.g., logical pages, logical erase blocks, described below), or the like.

The non-volatile memory controller 124 may comprise an SML 130, which may present a logical address space 134 to one or more storage clients 116. One example of an SML is the Virtual Storage Layer® of Fusion-io, Inc. of Salt Lake City, Utah. Alternatively, each non-volatile memory device 120 may comprise a non-volatile memory media controller 126, which may present a logical address space 134 to the storage clients 116. As used herein, a logical address space 134 refers to a logical representation of memory resources. The logical address space 134 may comprise a plurality (e.g., range) of logical addresses. As used herein, a logical address refers to any identifier for referencing a memory resource (e.g., data), including, but not limited to: a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, or the like.

The SML 130 may maintain metadata 135, such as a forward index, to map logical addresses of the logical address space 134 to media storage locations on the non-volatile memory device(s) 120. The SML 130 may provide for arbitrary, any-to-any mappings from logical addresses to physical storage resources. As used herein, an "any-to any" mapping may map any logical address to any physical storage resource. Accordingly, there may be no pre-defined and/or pre-set mappings between logical addresses and particular, media storage locations and/or media addresses. As used herein, a media address refers to an address of a memory resource that uniquely identifies one memory resource from another to a controller that manages a plurality of memory resources. By way of example, a media address includes, but is not limited to: the address of a media storage location, a physical memory unit, a collection of physical memory units (e.g., a logical memory unit), a portion of a memory unit (e.g., a logical memory unit address and offset, range, and/or extent), or the like. Accordingly, the SML 130 may map logical addresses to physical data resources of any size and/or granularity, which may or may not correspond to the underlying data partitioning scheme of the non-volatile memory device(s) 120. For example, in some embodiments, the non-volatile memory controller 124 is configured to store data within logical memory units that are formed by logically combining a plurality of physical memory units, which may allow the non-volatile memory controller 124 to support many different virtual memory unit sizes and/or granularities.

As used herein, a logical memory element refers to a set of two or more non-volatile memory elements that are or are capable of being managed in parallel (e.g., via an I/O and/or control bus). A logical memory element may comprise a plurality of logical memory units, such as logical pages, logical memory divisions (e.g., logical erase blocks), and so on. As used herein, a logical memory unit refers to a logical construct combining two or more physical memory units, each physical memory unit on a respective non-volatile memory element in the respective logical memory element (e.g., each non-volatile memory element being accessible in parallel). As used herein, a logical memory division refers to a set of two or more physical memory divisions, each physical memory division on a respective non-volatile memory element in the respective logical memory element.

The logical address space 134 presented by the SML 130 may have a logical capacity, which may correspond to the number of available logical addresses in the logical address space 134 and the size and/or granularity of the data referenced by the logical addresses. For example, the logical capacity of a logical address space 134 comprising $2^{32}$ unique logical addresses, each referencing 2048 bytes (2 KiB) of data may be $2^{43}$ bytes. As used herein, a kibibyte (KiB) refers to 1024 bytes. In some embodiments, the logical address space 134 may be thinly provisioned. As used herein, a "thinly provisioned" logical address space 134 refers to a logical address space 134 having a logical capacity that exceeds the physical capacity of the underlying non-volatile memory device(s) 120. For example, the SML 130 may present a 64-bit logical address space 134 to the storage clients 116 (e.g., a logical address space 134 referenced by 64-bit logical addresses), which may exceed the physical capacity of the underlying non-volatile memory devices 120. The large logical address space 134 may allow storage clients 116 to allocate and/or reference contiguous ranges of logical addresses, while reducing the chance of naming conflicts. The SML 130 may leverage the any-to-any mappings between logical addresses and physical storage resources to manage the logical address space 134 independently of the underlying physical storage devices 120. For example, the SML 130 may add and/or remove physical storage resources seamlessly, as needed, and without changing the logical addresses used by the storage clients 116.

The non-volatile memory controller 124 may be configured to store data in a contextual format. As used herein, a contextual format refers to a self-describing data format in which persistent contextual metadata is stored with the data on the physical storage media 122. The persistent contextual metadata provides context for the data with which it is stored. In certain embodiments, the persistent contextual metadata uniquely identifies the data with which the persistent contextual metadata is stored. For example, the persistent contextual metadata may uniquely identify a sector or block of data owned by a storage client 116 from other sectors or blocks of data owned by the storage client 116. In a further embodiment, the persistent contextual metadata identifies an operation that is performed on the data. In a further embodiment, the persistent contextual metadata identifies a sequence of operations performed on the data. In a further embodiment, the persistent contextual metadata identifies security controls, a data type, or other attributes of the data. In a certain embodiment, the persistent contextual metadata identifies at least one of a plurality of aspects, including data type, a unique data identifier, an operation, and a sequence of operations performed on the data.

The persistent contextual metadata may include, but is not limited to: a logical address of the data, an identifier of the data (e.g., a file name, object id, label, unique identifier, or the like), reference(s) to other data (e.g., an indicator that the data is associated with other data), a relative position or offset of the data with respect to other data (e.g., file offset, etc.), data size and/or range, and the like. The contextual data format may comprise a packet format comprising a data segment and one or more headers. Alternatively, a contextual data format may associate data with context information in other ways (e.g., in a dedicated index on the non-volatile memory media 122, a memory division index, or the like).

In some embodiments, the contextual data format may allow data context to be determined and/or reconstructed based upon the contents of the non-volatile memory media 122, and independently of other metadata, such as the arbitrary, any-to-any mappings discussed above. Since the media location of data is independent of the logical address of the data, it may be inefficient or impossible to determine the context of data based solely upon the media location or media address of the data. Storing data in a contextual format on the non-volatile memory media 122 may allow data context to be determined without reference to other metadata. For example, the contextual data format may allow the metadata to be reconstructed based only upon the contents of the non-volatile memory media 122 (e.g., reconstruct the any-to-any mappings between logical addresses and media locations).

In some embodiments, the non-volatile memory controller 124 may be configured to store data on one or more asymmetric, write-once media 122, such as solid-state storage media. As used herein, a "write once" storage medium refers to a storage medium that is reinitialized (e.g., erased) each time new data is written or programmed thereon. As used herein, an "asymmetric" storage medium refers to a storage medium 122 having different latencies for different storage operations. Many types of solid-state storage media are asymmetric; for example, a read operation may be much faster than a write/program operation, and a write/program operation may be much faster than an erase operation (e.g., reading the media may be hundreds of times faster than erasing, and tens of times faster than programming the media).

The memory media 122 may be partitioned into memory divisions that can be erased as a group (e.g., erase blocks) in order to, inter alia, account for the asymmetric properties of the media 122 or the like. As such, modifying a single data segment in-place may require erasing the entire erase block comprising the data, and rewriting the modified data to the erase block, along with the original, unchanged data. This may result in inefficient "write amplification," which may excessively wear the media 122. Therefore, in some embodiments, the non-volatile memory controller 124 may be configured to write data out-of-place. As used herein, writing data "out-of-place" refers to writing data to different media storage location(s) rather than overwriting the data "in-place" (e.g., overwriting the original physical location of the data). Modifying data out-of-place may avoid write amplification, since existing, valid data on the erase block with the data to be modified need not be erased and recopied. Moreover, writing data out-of-place may remove erasure from the latency path of many storage operations (e.g., the erasure latency is no longer part of the critical path of a write operation).

The non-volatile memory controller 124 may comprise one or more processes that operate outside of the regular path for servicing of storage operations (e.g., the "path" for performing a storage operation and/or servicing a storage request). As used herein, the "path for servicing a storage request" or "path for servicing a storage operation" (also referred to as the "critical path") refers to a series of processing operations needed to service the storage operation or request, such as a read, write, modify, or the like. The path for servicing a storage request may comprise receiving the request from a storage client 116, identifying the logical addresses of the request, performing one or more storage operations on non-volatile memory media 122, and returning a result, such as acknowledgement or data. Processes that occur outside of the path for servicing storage requests may include, but are not limited to: a groomer, de-duplication, and so on. These processes may be implemented autonomously and in the background, so that they do not interfere with or impact the performance of other storage operations and/or requests. Accordingly, these processes may operate independent of servicing storage requests.

In some embodiments, the non-volatile memory controller 124 comprises a groomer, which is configured to reclaim memory divisions (e.g., logical or physical erase blocks) for reuse, using a garbage collection or other storage capacity recovery process. The write out-of-place paradigm implemented by the non-volatile memory controller 124 may result in obsolete or invalid data remaining on the non-volatile memory media 122. For example, overwriting data X with data Y may result in storing Y on a new memory division (e.g., rather than overwriting X in place), and updating the any-to-any mappings of the metadata to identify Y as the valid, up-to-date version of the data. The obsolete version of the data X may be marked as invalid, but may not be immediately removed (e.g., erased), since, as discussed above, erasing X may involve erasing an entire memory division, which is a time-consuming operation and may result in write amplification. Similarly, data that is no longer is use (e.g., deleted or trimmed data) may not be immediately removed. The non-volatile memory media 122 may accumulate a significant amount of invalid data.

A groomer process may operate outside of the critical path for servicing storage operations. The groomer process may reclaim memory divisions so that they can be reused for other storage operations. As used herein, reclaiming a memory division refers to erasing the memory division so that new data may be stored/programmed thereon. Reclaiming a memory division may comprise relocating valid data on the memory division to a new location. The groomer may identify memory divisions for reclamation based upon one or more factors, which may include, but are not limited to: the amount of invalid data in the memory division, the amount of valid data in the memory division, wear on the memory division (e.g., number of erase cycles), time since the memory division was programmed or refreshed, and so on.

The non-volatile memory controller 124 may be further configured to store data in a log format. As described above, a log format refers to a data format that defines an ordered sequence of storage operations performed on a non-volatile memory media 122. In some embodiments, the log format comprises storing data in a pre-determined sequence of media addresses of the non-volatile memory media 122 (e.g., within sequential pages and/or erase blocks of the media 122). The log format may further comprise associating data (e.g., each packet or data segment) with respective sequence indicators. The sequence indicators may be applied to data individually (e.g., applied to each data packet) and/or to data groupings (e.g., packets stored sequentially on a memory division, such as an erase block). In some embodiments, sequence indicators may be applied to memory divisions when the memory divisions are reclaimed (e.g., erased), as described above, and/or when the memory divisions are first used to store data.

In some embodiments the log format may comprise storing data in an "append only" paradigm. The non-volatile memory controller 124, using the log storage module 137 described below or the like, may maintain a current append point at a media address of the non-volatile memory device 120. The append point may be a current memory division and/or offset within a memory division. Data may then be sequentially appended from the append point. The sequential ordering of the data, therefore, may be determined based upon the sequence indicator of the memory division of the data in combination with the sequence of the data within the memory division. Upon reaching the end of a memory division, the non-volatile memory controller 124 may identify the "next" available memory division (e.g., the next memory division that is initialized and ready to store data). The groomer may reclaim memory divisions comprising invalid, stale, and/or deleted data, to ensure that data may continue to be appended to the media log.

The log format described herein may allow valid data to be distinguished from invalid data based upon the contents of the non-volatile memory media 122, and independently of other metadata. As discussed above, invalid data may not be removed from the non-volatile memory media 122 until the memory division comprising the data is reclaimed. Therefore, multiple "versions" of data having the same context may exist on the non-volatile memory media 122 (e.g., multiple versions of data having the same logical addresses). The sequence indicators associated with the data may be used to distinguish invalid versions of data from the current, up-to-date version of the data; the data that is the most recent in the log is the current version, and previous versions may be identified as invalid.

The storage management layer 130 may be configured to provide storage services to one or more storage clients 116. The storage clients 116 may include local storage clients 116 operating on the computing device 110 and/or remote, storage clients 116 accessible via the network 115 and/or network interface 113. The storage clients 116 may include, but are not limited to: operating systems, file systems, database applications, server applications, kernel-level processes, user-level processes, applications, and the like.

The storage management layer 130 comprises and/or is communicatively coupled to one or more non-volatile memory devices 120. The one or more non-volatile memory devices 120 may include different types of non-volatile memory devices including, but not limited to: solid-state storage devices, hard drives, SAN storage resources, or the like. The one or more non-volatile memory devices 120 may comprise one or more respective non-volatile memory media controllers 126 and non-volatile memory media 122. As illustrated in FIG. 1, The SML 130 may provide access to the one or more non-volatile memory devices 120 via a traditional block I/O interface 131. Additionally, the SML 130 may provide access to enhanced functionality (e.g., a large, virtual address space 134) through the SML interface 132. The metadata 135 may be used to manage and/or track storage operations performed through any of the Block I/O interface 131, SML interface 132, cache interface 133, or other, related interfaces.

The cache interface 133 may expose cache-specific features accessible via the storage management layer 130. Also, in some embodiments, the SML interface 132 presented to the storage clients 116 provides access to data transformations implemented by the one or more non-volatile memory devices 120 and/or the one or more non-volatile memory media controllers 126.

The SML 130 may provide storage services through one or more interfaces, which may include, but are not limited to: a block I/O interface, an extended storage management layer interface, a cache interface, and the like. The SML 130 may present a logical address space 134 to the storage clients 116 through one or more interfaces. As discussed above, the logical address space 134 may comprise a plurality of logical addresses, each corresponding to respective media locations the on one or more non-volatile memory devices 120. The SML 130 may maintain metadata 135 comprising any-to-any mappings between logical addresses and media locations, as described above.

The SML 130 may further comprise a log storage module 137 that is configured to store data in a contextual, log format. The contextual, log data format may comprise associating data with persistent contextual metadata, such as the logical address of the data, or the like. The contextual, log format may further comprise associating data with respective sequence identifiers on the non-volatile memory media 122, which define an ordered sequence of storage operations performed on the one or more non-volatile memory devices 120, as described above.

The SML 130 may further comprise a non-volatile memory device interface 139 configured to transfer data, commands, and/or queries to the one or more non-volatile memory devices 120 over a bus 125, which may include, but is not limited to: a peripheral component interconnect express (PCI Express or PCIe) bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, a network 115, Infiniband, SCSI RDMA, or the like. The non-volatile memory device interface 139 may communicate with the one or more non-volatile memory devices 120 using input-output control (IO-CTL) command(s), IO-CTL command extension(s), remote direct memory access, or the like.

The communication interface 113 may comprise one or more network interfaces configured to communicatively couple the computing device 110 and/or the non-volatile memory controller 124 to a network 115 and/or to one or more remote, network-accessible storage clients 116. The storage clients 116 may include local storage clients 116 operating on the computing device 110 and/or remote, storage clients 116 accessible via the network 115 and/or the network interface 113. The non-volatile memory controller 124 comprises one or more non-volatile memory devices 120. Although FIG. 1 depicts a single non-volatile memory device 120, the disclosure is not limited in this regard and could be adapted to incorporate any number of non-volatile memory devices 120.

The non-volatile memory device 120 may comprise non-volatile memory media 122, which may include but is not limited to: NAND flash memory, NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), resistive RAM (RRAM), programmable metallization cell (PMC), conductive-bridging RAM (CBRAM), magneto-resistive RAM (MRAM), dynamic RAM (DRAM), phase change RAM (PRAM or PCM), magnetic storage media (e.g., hard disk, tape), optical storage media, or the like. While the non-volatile memory media 122 is referred to herein as "memory media," in various embodiments, the non-volatile memory media 122 may more generally comprise a non-volatile recording media capable of recording data, which may be referred to as a non-volatile memory media, a non-volatile storage media, or the like. Further, the non-volatile memory device 120, in various embodiments, may comprise a non-volatile recording device, a non-volatile memory device, a non-volatile storage device, or the like.

The non-volatile memory media 122 may comprise one or more non-volatile memory elements 123, which may include, but are not limited to: chips, packages, planes, die, and the like. A non-volatile memory media controller 126 may be configured to manage storage operations on the non-volatile memory media 122, and may comprise one or more processors, programmable processors (e.g., field-programmable gate arrays), or the like. In some embodiments, the non-volatile memory media controller 126 is configured to store data on and/or read data from the non-volatile memory media 122 in the contextual, log format described above, and to transfer data to/from the non-volatile memory device 120, and so on.

The non-volatile memory media controller 126 may be communicatively coupled to the non-volatile memory media 122 by way of a bus 127. The bus 127 may comprise an I/O bus for communicating data to/from the non-volatile memory elements 123. The bus 127 may further comprise a control bus for communicating addressing and other command and control information to the non-volatile memory elements 123. In some embodiments, the bus 127 may communicatively couple the non-volatile memory elements 123 to the non-volatile memory media controller 126 in parallel. This parallel access may allow the non-volatile memory elements 123 to be managed as a group, forming a logical memory element 129. As discussed above, the logical memory element may be partitioned into respective logical memory units (e.g., logical pages) and/or logical memory divisions (e.g., logical erase blocks). The logical memory units may be formed by logically combining physical memory units of each of the non-volatile memory elements. For example, if the non-volatile memory media 122 comprises twenty-five (25) non-volatile memory elements, each logical memory unit may comprise twenty-five (25) pages (e.g., a page of each element of non-volatile memory media 122).

The non-volatile memory controller 124 may comprise an SML 130 and the non-volatile memory media controller 126. The SML 130 may provide storage services to the storage clients 116 via one or more interfaces 131, 132, and/or 133. In some embodiments, the SML 130 provides a block-device I/O interface 131 through which storage clients 116 perform block-level I/O operations. Alternatively, or in addition, the SML 130 may provide a storage management layer (SML) interface 132, which may provide other storage services to the storage clients 116. In some embodiments, the SML interface 132 may comprise extensions to the block device interface 131 (e.g., storage clients 116 may access the SML interface 132 through extensions to the block device interface 131). Alternatively, or in addition, the SML interface 132 may be provided as a separate API, service, and/or library. The SML 130 may be further configured to provide a cache interface 133 for caching data using the non-volatile memory system 102.

As described above, the SML 130 may present a logical address space 134 to the storage clients 116 (e.g., through the interfaces 131, 132, and/or 133). The SML 130 may maintain metadata 135 comprising any-to-any mappings between logical addresses in the logical address space 134 and media locations on the non-volatile memory device 120. The metadata 135 may comprise a logical-to-physical mapping structure with entries that map logical addresses in the logical address space 134 and media locations on the non-volatile memory device 120. The logical-to-physical mapping structure of the metadata 135, in one embodiment, is sparsely populated, with entries for logical addresses for which the non-volatile memory device 120 stores data and with no entries for logical addresses for which the non-volatile memory device 120 does not currently store data. The metadata 135, in certain embodiments, tracks data at a block level, with the SML 130 managing data as blocks.

The non-volatile memory system 102 may further comprise a log storage module 137, which, as described above, may be configured to store data on the non-volatile memory device 120 in a contextual, log format. The contextual, log data format may comprise associating data with a logical address on the non-volatile memory media 122. The contextual, log format may further comprise associating data with respective sequence identifiers on the non-volatile memory media 122, which define an ordered sequence of storage operations performed on the non-volatile memory media 122, as described above. The non-volatile memory controller 124 may further comprise a non-volatile memory device interface 139 that is configured to transfer data, commands, and/or queries to the non-volatile memory media controller 126 over a bus 125, as described above.

Figure 2:
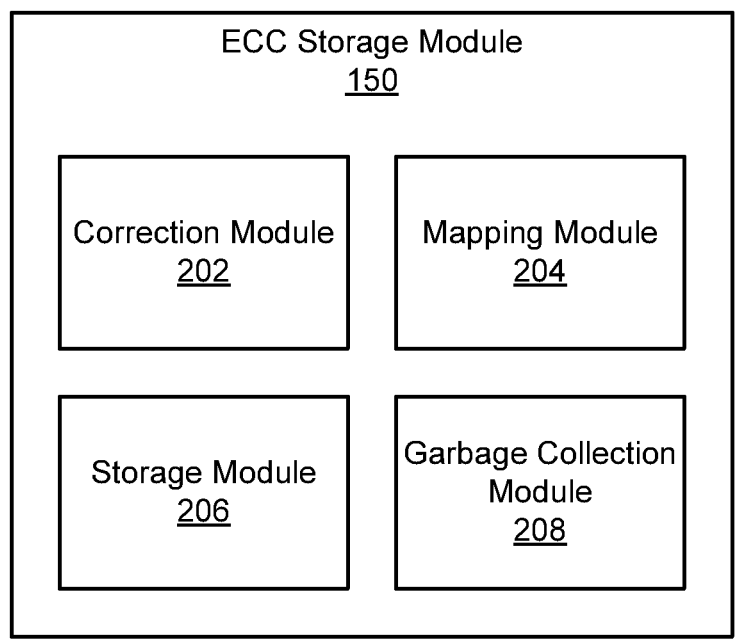
FIG. 2 is a schematic block diagram illustrating one embodiment of an ECC storage module.

FIG. 2 depicts one embodiment of an ECC storage module 150. The ECC storage module 150 may be substantially similar to the ECC storage module 150 described above with regard to FIG. 1. In general, as described above, the ECC storage module 150 determines where portions of an ECC code word of data are stored, storing different portions of the ECC code word in different sets of storage cells of a non-volatile storage device 120, thereby amortizing, leveling, averaging, and/or evening out error rates for ECC code words. In the depicted embodiment, the ECC storage module 150 includes a correction module 202, a mapping module 204, a storage module 206, and a garbage collection module 208.

In one embodiment, the correction module 202 is configured to determine an error-correction code (ECC) code word of data for storage on the one or more non-volatile storage media 122. As used herein, an ECC code word or ECC chunk of data comprises a block or segment of data encoded with, stored with, and/or otherwise associated with redundant data that may be used to detect and/or correct one or more errors in the data. An ECC code word or ECC chunk, in certain embodiments, includes both user data/workload data and redundant data (e.g., ECC check bits, parity data, or the like) stored with the user data/workload data. In some embodiments, errors may be introduced in data over time due to electron leakage, read disturb, program disturb, during data transmission, or the like. The ECC code words may comprise parity data, checksums, cyclic redundancy check (CRC) data, hash values, and/or the like.

In certain embodiments, an error correcting code for a code word of the correction module 202 may be one of various types of error correcting codes, such as a block code, a convolutional code, a Bose-Chaudhuri-Hocquenghem (BCH) code, a low-density parity check (LDPC) code, a Hamming code, a Reed-Solomon code, a turbo code, or the like. In certain embodiments, an error correcting code may be a systematic error correcting code, so that each ECC code word may store data received by an encoder (e.g., user data, workload data), as well as parity bits, or ECC check bits. A systematic error correcting code, as used herein, may comprise an error correcting code that includes or combines the input data in the output ECC code word or chunk, so that the ECC code word or chunk includes the input data directly. This means that the input data (e.g. the message) is readily identifiable in the ECC code word. In other words, the input data (e.g. the message) is either not transformed/encoded or is encoded/transformed with a unity encoding. A non-systematic code, as used herein, may comprise an error correcting code that encodes or transforms the input data so that the encoded output includes the input data encoded together with other ECC check bits (e.g., parity bits, redundant bits). This means that the input data (e.g. the message) is not readily identifiable in the ECC code word. An ECC code word generated by a systematic error correcting code may store ECC check bits or parity bits before the non-encoded input data, after the non-encoded input data, or at one or more other locations within the non-encoded input data. An ECC code word generated by a non-systematic error correcting code may provide error detection and/or correction using the data encoding itself, with or without separate ECC check bits. In a non-systematic error correcting code, the output may comprise an ECC code word which itself may be considered the ECC check bits.

In one embodiment, the correction module 202 is configured to determine an ECC code word of data by receiving the ECC code word (e.g., at a controller 126 or the like) from a software ECC encoder executing on the host computing device 110, from a hardware ECC encoder of the non-volatile memory media controller 126, or from another entity. For example, the correction module 202 may receive an ECC code word from a non-volatile memory controller 124, a non-volatile memory media controller 126, an SML 130, a device driver, a field-programmable gate array (FPGA) or other programmable logic, firmware for an FPGA or other programmable logic, microcode for execution on a microcontroller, an application-specific integrated circuit (ASIC), or the like.

In some embodiments, the correction module 202 determines an ECC code word of data by generating and/or encoding an ECC code word based on the data. For example, in certain embodiments, the correction module 202 may comprise a software ECC encoder executing on the host computing device 110, a hardware ECC encoder disposed on the non-volatile memory device 120 (e.g., as part of the non-volatile memory media controller 126), or another ECC encoder that generates, encodes, or otherwise determines ECC code words. The correction module 202, for example, may employ an ECC algorithm, such as a block code, a convolutional code, a BCH code, an LDPC code, a Hamming code, a Reed-Solomon code, a turbo code, or the like, to generate an ECC code word of data. In one embodiment, computer executable code of the correction module 202 is executable to perform operations to determine an ECC code word of data by encoding data into the ECC code word, logic hardware of the correction module 202 is configured to determine an ECC code word of data by encoding data into the ECC code word, or the like.

In one embodiment, the correction module 202 is further configured to divide, split, partition, segment, or the like, a determined ECC code word into one or more portions or segments. In one embodiment, the correction module 202 divides the code word into at least a first portion and a second portion. In certain embodiments, the correction module 202 divides an ECC code word into multiple portions that each have the same size. For example, the first and second portions of a 2 KiB ECC code word may each comprise 1 KiB portions of the ECC code word. In another embodiment, the correction module 202 may divide an ECC code word into portions with different sizes. For example, the first portion of a 4 KiB ECC code word may be 3 KiB and the second portion of an ECC code word may be 1 KiB.

The size and/or number of the portions, in one embodiment, corresponds to a number of memory elements 123 in a storage channel of the non-volatile storage media 122. For example, the correction module 202 may partition an ECC code word into eight portions for a non-volatile storage device 120 that has a storage channel comprising eight memory die or other memory elements 123. In another embodiment, the correction module 202 may divide an ECC code word into portions of a predefined size, a predefined number of portions, or the like that is not based on a number of memory elements 123 in a channel, such that the ECC code word is not stored on each memory element 123 of the channel, but instead portions of multiple ECC code words may be written to the channel at a time. As used herein, a storage or memory channel comprises a plurality of storage or memory elements 123 that may be accessed (e.g., written/programmed and/or read) in parallel, in association with the same operation, or the like. For example, multiple dies or other memory elements 123 may be coupled to one or more common enable lines or other control lines, so that each die in a channel is enabled to receive and/or execute a command in response to the same signal or other trigger from the non-volatile memory media controller 126, or the like.

In one embodiment, the mapping module 204 is configured to determine one or more addresses for an ECC code word from the correction module 202 (e.g., for different portions or segments of the ECC code word). The mapping module 204, in certain embodiments, may determine addresses for portions of an ECC code word so that a portion of the ECC code word is stored at a first physical address or location within a first memory element 123 and a second portion is stored at a different physical address or location within a second memory element 123. In some embodiments, computer executable code of the mapping module 204 is executable to determine one or more addresses for an ECC code word (e.g., by adjusting or mapping one or more addresses for the ECC code word or the like) so that a portion of the ECC code word is stored in a different physical address or location within a first memory element 123 and a portion of the ECC code word is stored in a different physical address or location within a second memory element 123. In a further embodiment, logic hardware of the mapping module 204 is configured to determine one or more addresses for an ECC code word so that a portion of the ECC code word is stored in a different physical address or location within a first memory element 123 and a portion of the ECC code word is stored in a different physical address or location within a second memory element 123.

In certain embodiments, the mapping module 204 determines one or more different addresses for different portions of an ECC code word that correspond to one or more different locations (e.g., different physical addresses) within a set of memory structures (e.g., strings) of storage cells of the non-volatile storage media 122. For example, if the correction module 202 divides the ECC code word into two portions, the mapping module 204 may determine addresses for the first and second portions such that the first portion of the ECC code word is stored in a first location within a first set of strings of storage cells and the second portion of the ECC code word is stored in a second location (e.g., a different location) within a second set of strings of storage cells of the non-volatile storage media 122. In certain embodiments, the mapping module 204 determines different physical addresses corresponding to different locations within or relative to different memory elements 123 (e.g., different physical addresses for different portions of an ECC code word may cause a first portion to have a different position relative to a first memory element 123 than a second portion has relative to a second memory element 123 or relative to a string or memory structure of storage cells).

In one embodiment, a physical storage location within a memory element 123 may comprise a word line, a page, an erase block, a region of a memory element 123, a storage area, a portion of a storage area, or another set of one or more storage cells of a memory element 123. In certain embodiments, different physical storage locations of a memory element 123 may have different error rates, such as a raw bit error rate (RBER), an uncorrectable bit error rate (UBER), or other bit error rate (BER). As used herein, an error rate may indicate a reliability for a storage location, a memory element 123, a storage cell, a word line, a page, or the like. In certain embodiments, a storage location that has a lower error rate than a different storage location may have a higher reliability than the different storage location.

For example, a word line of storage cells nearest to source gates of vertical memory structures may have a lower error rate, and therefore a higher reliability, than a word line of storage cells farthest from the source gates (e.g., a word line nearest to drain gates of the vertical memory structures). In some embodiments, storage locations that have a low error rate (e.g., lower than an average error rate for a memory element 123, for the non-volatile memory device 120, lower than a predetermined error rate threshold, or the like) may be referred to as good storage locations, strong storage locations, reliable storage locations, or the like. Storage locations that have a high error rate (e.g., higher than an average error rate for a memory element 123, for the non-volatile memory device 120, higher than a predetermined error rate threshold, or the like), in some embodiments, may be referred to as bad storage locations, weak storage locations, unreliable storage locations, or the like. In some embodiments, a memory element 123 may comprise a plurality of storage locations that exhibit various error rates.

In one embodiment, storage cells or other storage locations (e.g., pages, word lines, or the like) are predefined and/or pre-identified for the mapping module 204 by a manufacturer, a designer, an administrator, a vendor, a user, or the like, based on an error rate characterization (e.g., measurements) of storage cells of the memory media 122, based on a physical and/or electrical property of the storage cells, or the like. In certain embodiments, the mapping module 204 may dynamically determine which storage cells have a low or high error rate by determining error rates for different storage locations or other sets of storage cells and comparing the determined error rates to a predetermined error rate threshold, such as an average error rate for a memory element 123, for the device 120, or the like. For example, if an error rate is represented by values between one and ten, the mapping module 204 may determine that a storage location that has an error rate of five or less has a low error rate and a storage location that has an error rate greater than five has a high error rate, or the like. The mapping module 204, based on the defined or determined error rate values for one or more storage cells of one or more memory elements 123, may determine addresses corresponding to storage locations with different error rates or other reliability characteristics for different portions of an ECC code word.

In some embodiments, the mapping module 204 may determine an address for a storage location that has a low error rate for a first portion of an ECC code word and an address for a storage location that has a high error rate for a second portion of an ECC code word. For example, the mapping module 204 may determine an address for a first portion of an ECC code word in a low error rate word line of a memory element 123 and an address for a second portion of the ECC code word in a high error rate word line of a different memory element 123. In this manner, the ECC storage module 150 may achieve a lower error rate or a more even, consistent error rate across a non-volatile storage device 120 by distributing the storage of an ECC code word using reliable (e.g., low error rate) storage locations with less-reliable (e.g., high error rate) storage locations.

In certain embodiments, the mapping module 204 may determine an address for a portion of an ECC code word that corresponds to a high error rate storage location, but may determine an address for redundant or parity data (e.g., ECC check bits) of the ECC code word that corresponds to a low error rate storage location, to ensure that the redundant or parity data is stored in a low error rate, reliable storage location. In such an embodiment, there may be a higher likelihood that the correction module 202 may decode and correct one or more errors in the ECC code word than if the redundant or parity data where stored in a high error rate, unreliable storage location.

In one embodiment, the mapping module 204 determines one or more physical addresses within a non-volatile storage device 120 that comprises and stores data in vertical memory structures (e.g., the memory elements 123 may comprise vertical memory structures for storing data). In some embodiments, the vertical memory structure comprises a three-dimensional (3D), vertical, NAND flash memory structure. As used herein, a vertical memory structure or vertical storage structure may comprise a string or unit of cells (e.g., storage cells, memory cells) that are formed or manufactured at least partially on edge, vertically, as opposed to being built in a conventional two-dimensional (2D), planar configuration (e.g., at least part of a row or string of cells may be aligned perpendicular to a substrate instead of being aligned parallel to the substrate). One embodiment of a vertical memory structure is a 3D, vertical, NAND flash memory structure. Types of 3D NAND flash memory elements 123 may include charge trapping flash memory configurations, floating gate memory configurations, or the like, such as bit-cost scalable (BiCS) (e.g., pipe-shaped BiCS or P-BiCS), 3D Stacked NAND, vertical NAND (VNAND), vertical recess array transistor (VRAT), zigzag VRAT (Z-VRAT), vertical stacked array transistor (VSAT), vertical gate (VG) NAND, terabit cell array transistor (TCAT) NAND, or the like.

In one embodiment, a vertical memory structure is shaped such that the vertical memory structure comprises a string of one or more storage cells that is oriented in a vertical position as opposed to a planar or horizontal position. In such an embodiment, the vertical memory structure may include various sizes, shapes, designs, architectures, or the like, as depicted in FIGS. 3A-3C below. For example, in one embodiment, the vertical memory structure may comprise a "U" shape such that storage cells are aligned along the vertical portions of the "U." In some embodiments, the first set of cells of the "U" shaped architecture comprise source side storage cells of the non-volatile storage media 122 and the second set of cells comprise drain side storage cells of the one or more non-volatile storage media 122.

In some embodiments, the string of one or more storage cells of a vertical memory structure may be organized into vertical levels. A string of cells may have as few as 2, 4, 8, 16 or 32 levels or as many as 128 or 256 levels, or more. In a linear or "I" shaped vertical memory structure, storage cells may be arranged in a vertical stack or column (e.g., stacked in a line, spiraling or rotating around a column, or the like), as depicted in FIGS. 3B and 3C. In a "U" shaped vertical memory structure, a single string of one or more storage cells may extend downward, bend, and return in the vertical direction in order to form two adjacent, but connected stacks or columns, as depicted in FIG. 3A.

As used herein, source side storage cells may comprise storage cells nearer to, or having a shorter path to, the select gate source (SGS) than the select gate drain (SGD) of a memory structure. The SGS is the gate, side, portion, area, or the like of the memory structure where a threshold voltage is applied to produce a potential during an erase operation. For example, in a gate-induced drain leakage (GIDL) erase process, holes are generated at a junction side edge of the SGS. Drain side storage cells, as used herein, comprise storage cells nearer to, or having a shorter path to, the select gate drain (SGD) of a memory structure. The SGD is the gate, side, portion, area, or the like of the memory structure where a threshold voltage is applied to produce a potential during a program operation. In some embodiments, drain side storage cells comprise storage cells that have a longer path to the SGS than to the SGD. For example, on a 3D. vertical NAND flash memory structure that comprises eight storage cells, storage cells 0-3 may have a shorter path to the SGS and a longer path to the SGD and may comprise source-side cells of the memory structure, while memory cells 4-7 may have a longer path to the SGS and a shorter path to the SGD and may comprise drain-side cells of the memory structure.

In some embodiments, (e.g., for certain "U" shaped memory structures, P-BiCS, or the like) source-side cells may have a lower error rate than drain-side cells due to a deviation or drift of voltages stored in the drain-side cells from an average stored voltage level. For example, an erase process, such as a GIDL process, may not form a uniform potential, may produce a varied potential, or the like in drain-side cells due to the greater distance of the drain-side cells from the SGS than the source-side cells. In certain embodiments, as the linear distance between a storage cell and the SGS becomes greater, such as in the case for drain-side storage cells, the deviation from an average or target voltage level increases, which may cause bit errors in data if the stored read voltage level crosses a read voltage threshold, or the like. In certain embodiments, errors in drain-side cells may be due to additional wear on the drain-side cells due to extra iterations or pulses of an erase procedure, which may be used to erase the drain-side cells due to the inconsistent or varied potential applied to the drain-side cells during the erase procedure, leading to different or unreliable storage cell characteristics for drain-side cells.

In one example, storage cells along a first side of a "U" shaped memory structure may comprise source-side cells because they may each have shorter paths to the SGS than drain-side storage cells along an opposite, second side of the "U" shaped memory structure. The storage cells along the opposite, second side of the "U" shape may comprise drain-side storage cells because they may have longer paths to the SGS, or, alternatively, shorter paths to the SGD than the source-side storage cells. In one embodiment, different word lines of storage cells in the same memory element 123 (e.g., die) may not be programmed at the same time. Therefore, different cells of the same memory structure, in certain embodiments, may not be programmed at the same time. For this reason, in one embodiment, the mapping module 204 may determine addresses for different portions on an ECC code word in different storage elements 123, since the portions of the ECC code word may not be stored in multiple word lines or other storage locations within the same memory element 123, without using a sequence of multiple program operations on the memory element 123, which would at least double the time to write the ECC code word. Writing or programming different portions of an ECC chunk to different memory elements 123, in certain embodiments, may occur substantially simultaneously, may overlap, or the like.

For example, the mapping module 204 may determine an address of source-side storage cells in a first set of one or more die 123 and an address of drain-side storage cells in a second set of one or more die 123 of the non-volatile memory media 122 for storing different portions of an ECC code word. For example, in a non-volatile storage device 120 comprising eight die in a channel, the mapping module 204 may determine addresses for a first set of storage cells comprising source-side storage cells of die 0, 2, 4, and 6, and addresses for a second set of storage cells comprising drain-side storage cells of die 1, 3, 5, and 7, or the like. Thus, for "U" shaped vertical memory structures, the mapping module 204 may determine addresses for a first portion of an ECC code word so that the first portion of the ECC code word is stored in source-side storage cells in "U" shaped memory structures of one or more memory elements 123 and may determine different addresses for a second portion of the ECC code word so that the second portion of the ECC code word is stored in drain-side storage cells in "U" shaped memory structures of one or more different memory elements 123.

While source-side cells of a "U" shaped memory structure may be more reliable and/or have a lower error rate than drain-side cells, other geometries or architectures may have different error rate characteristics. For example, various "I" shaped memory structures, with different error rate characteristics, are described below with regard to FIGS. 3B and 3C. The mapping module 204, in certain embodiments, may determine or adjust addresses for different portions of an ECC code word so that a first portion of the ECC code word is stored in cells with a lower error rate and a second portion of the ECC code word is stored in cells with a higher error rate, based on error rate characteristics of the cells, an architecture or geometry of the cells, or the like.

In one embodiment, a vertical memory structure may comprise different bands, regions, areas, or the like of storage cells that are classified as low/high error rate storage cells, reliable/unreliable storage cells, good/bad error rate cells, or the like, based on an architecture of the vertical memory structure. For example, a vertical memory structure may include three horizontal or vertical low/high error rate bands or areas of cells, or the like. A vertical memory structure may include a top band of cells that have a low error rate (e.g., strong or good cells), a middle band of cells that have a high error rate (e.g., weak or bad cells), and a bottom band of cells that have a low error rate (e.g., strong or good cells), or may have another arrangement of cells. In such an embodiment, the mapping module 204 may determine addresses of cells or storage locations within the determined bands in order to store an ECC code word portion in a low error rate band and a different portion of the ECC code word in a high error rate band, of a different storage element 123 or the like.

In certain embodiments, as described above, the mapping module 204 may determine an address for parity data, redundant data, ECC check bits, or the like of an ECC code word, the address corresponding to a low error rate storage location. In such an embodiment, the mapping module 204 may determine an address for another portion of the ECC code word, the address corresponding to a high error rate storage location. For example, the mapping module 204 may determine one or more addresses for source-side cells from strings of storage cells, which may have a low error rate, for the parity data and one or more addresses for drain-side cells from different strings of storage cells (e.g., strings in a different memory element 123), which have a high error rate. In this manner, the storage module 206 may store a portion of the ECC code word in a high error rate storage location, in order to utilize the available storage capacity, so that the correction module 202 may use the parity data, redundant data, or ECC check bits for the ECC code word, which are stored in a low error rate storage location, to recover the ECC code in the event of errors.

In one embodiment, the mapping module 204 determines an address for an ECC code word, or a portion of an ECC code word, based on or to satisfy a page programming order for the non-volatile storage device 120, for a non-volatile memory element 123, or the like. For example, in certain embodiments, a page programming order may dictate that pages of a non-volatile memory element 123 be programmed in a sequential order, to account for program disturb effects, a bit encoding of the pages, or the like. To cause different portions of an ECC code word to be stored in different locations, in one embodiment, the mapping module 204 may allow certain storage cells, pages, word lines, or other storage locations to go unused, as described in greater detail below with regard to FIG. 4A. Alternatively, in another embodiment, pages of a non-volatile memory medium may be programmed out of order, allowing the mapping module 204 to determine different addresses for different portions of ECC code words, without allowing storage locations to go unused.

In one embodiment, the mapping module 204 stores determined physical addresses for different portions of an ECC code word in a logical-to-physical mapping structure, in association with one or more logical addresses for the ECC code word, so that the different portions of the ECC code word may be read from the different physical addresses. In a further embodiment, the mapping module 204 may perform a predefined or known adjustment or mapping for each ECC code word written/programmed to and read from a non-volatile memory element 123, so that just one or more original, unadjusted physical addresses may be stored in a logical-to-physical mapping structure. For example, the mapping module 204 may add a predefined offset to one or more portions of an ECC code word (e.g., every other portion, alternating portions, or the like), may subtract a predefined offset from one or more portions of an ECC code word (e.g., every other portion, alternating portions, or the like), or may perform another predefined mapping, adjustment, or transformation to physical addresses so that different portions of an ECC code word are stored in different physical locations with different error rates, different reliabilities, or the like.

In certain embodiments, the mapping module 204 determines or adjusts addresses for portions of an ECC code word so that a greater percentage of the ECC code word is stored in storage cells having a lower error rate, a higher reliability, or the like. In one embodiment, the mapping module 204 may determine what percentage of an ECC code word is stored in storage cells having a lower error rate/higher reliability and what percentage of the ECC code word is stored in storage cells having a higher error rate/lower reliability based on a priority or QoS level for data of the ECC code word, storing a greater percentage of an ECC code word with a higher priority or QoS level in storage cells having a lower error rate/higher reliability, storing a greater percentage of an ECC code word with a lower priority or QoS level in storage cells having a higher error rate/lower reliability, or the like. In a further embodiment, the mapping module 204 may determine addresses so that all or substantially all ECC code words are stored with a greater percentage in cells having a lower error rate/higher reliability. In another embodiment, the mapping module 204 may increase a percentage of data (e.g., portions of ECC code words) that is stored in lower error rate/higher reliability cells over time, as the non-volatile memory media 122 ages (e.g., to maintain a consistent error rate, to prevent an error rate from exceeding a threshold, to extend a usable lifetime of the non-volatile memory device 120, or the like).

In embodiments where more lower error rate/higher reliability cells are used than higher error rate/lower reliability cells, where certain higher error rate/lower reliability cells go unused, or the like, the mapping module 204 may rotate which higher error rate/lower reliability cells are used to store data (e.g., portions of ECC code words), to extend a usable lifetime of the higher error rate/lower reliability cells or the like.

In one embodiment, a storage module 206 is configured to store or cause an ECC code word to be stored in the one or more non-volatile storage media 122 based on one or more addresses determined by the mapping module 204. For example, the storage module 206 may service one or more write requests by storing a first portion of an ECC code word in a first storage location and a second portion of the ECC code word in a second storage location of a non-volatile storage device 120. In certain embodiments, the storage module 206 stores different portions of an ECC code word in memory cells having different locations and/or physical addresses in different memory elements 123, based on one or more addresses determined by the mapping module 204, as described above.

The storage module 206, based on the determined addresses, may store a portion of an ECC code word in storage cells that have a low error rate/high reliability (e.g., an error rate below a predetermined threshold), and may store a different portion of the ECC code word in storage cells that have a high error rate/low reliability (e.g., an error rate above a predetermined threshold). In some embodiments, the storage module 206 stores a first portion of an ECC code word on a first die 123 or other memory element 123 and a second portion of an ECC code word on a second die 123 or other memory element 123. For example, the storage module 206 may store a first portion of an ECC code word in one or more word lines of a first die 123, having a first position or location in memory structures of the first die 123, and may store a second portion of the ECC code word in one or more word lines of a second die 123, having a different position or location in memory structures of the second die 123. In this manner, the storage module 206 may simultaneously program an ECC code word to the first and second die 123 to service a write request, read the ECC code word from the first and second die 123 in order to service a read request, or the like.

Figure 4A:
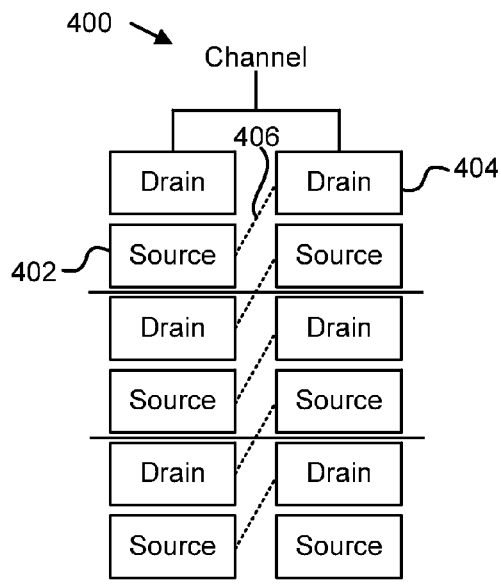
FIG. 4A is a schematic block diagram illustrating one embodiment of a storage channel for distributing storage of ECC code words.
Figure 4B:
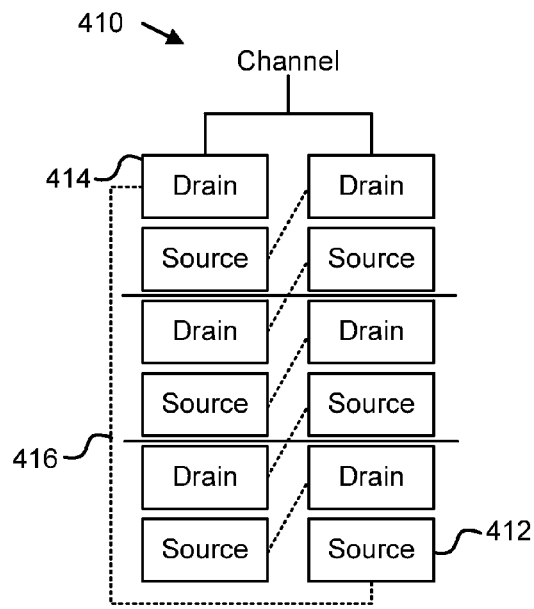
FIG. 4B is a schematic block diagram illustrating a further embodiment of a storage channel for distributing storage of ECC code words.

In certain embodiments, the storage module 206 stores an ECC code word and/or causes an ECC code word to be stored in die 123 or other memory elements 123 that are coupled as a storage channel, as depicted in FIGS. 4A and 4B. As described above, one or more control lines (e.g., enable lines) for different storage elements 123 may be electrically coupled, in parallel or the like, to associate the storage elements 123 into a channel. In certain embodiments, based on addresses determined by the mapping module 204, different locations or physical addresses in different storage elements 123 of a channel may be paired or associated with each other to store an ECC code word. For example, at least a portion of the storage cells of a first die 123 may comprise storage cells that have a lower error rate than at least a portion of the storage cells of a second die 123 that are paired with the storage cells of the first die 123, or the like. Similarly, in certain embodiments, at least a portion of the storage cells of the second die 123 may comprise storage cells that have a lower error rate than at least a portion of the storage cells of the first die 123 that are paired with the storage cells of the second die 123.

In one embodiment, the garbage collection module 208 is configured to recover storage capacity from one or more storage cells, memory elements 123, die 123, non-volatile memory media 122, or the like (e.g., erase blocks), as described above with regard to the groomer. In certain embodiments, the garbage collection module 208 recovers storage capacity of a first set of storage cells (e.g., an erase block) that stores at least a first portion of an ECC code word, on a first memory element 123 or the like. In response to or in coordination with recovering the storage capacity of the first set of storage cells, the garbage collection module 208 may recover a storage capacity of a second set of storage cells (e.g., erase block), which stores at least a second portion of the ECC code word, on a second memory element 123 or the like.

In this manner, the garbage collection module 208 may recover a storage capacity of an entire ECC code word at a time, copying the ECC code word to one or more new physical locations (e.g., based on new addresses determined for the ECC code word by the mapping module 204) and erasing the erase blocks that previously stored the ECC code word to recover their storage capacity. The garbage collection module 208, in some embodiments, recovers storage capacity for an erase block of the non-volatile memory media 122 in response to storage capacity of the non-volatile memory device 120 falling below a threshold, in response to a retention time for the erase block satisfying a threshold, in response to a garbage collection command or request, or the like.

In some embodiments, one or more of the correction module 202, the mapping module 204, the storage module 206, and the garbage collection module 208 comprise computer executable code of a device driver for the one or more non-volatile storage media 122. In certain embodiments, the computer executable code is stored on a computer readable storage medium.

In a further embodiment, computer executable code of the correction module 202 is executable to perform operations to determine an ECC code word of data by encoding data into the ECC code word or the like, as described above. In one embodiment, computer executable code of the mapping module 204 is executable to determine one or more addresses for the ECC code word by adjusting one or more addresses for the ECC code word so that a portion of the ECC code word is stored in a first location in a first memory element 123 and a portion of the ECC code word is stored in a different location in a second memory element 123, or the like, as described above. Computer executable code of the storage module 206, in certain embodiments, is executable to store the portions of the ECC code words in the different locations in the first and second memory elements 123. Computer executable code of the garbage collection module 208, in one embodiment, may be executable to recover storage capacity of an erase block in one memory element 123 that stores a portion of an ECC code word in response to recovering storage capacity of a second erase block in a different element 123 that stores a portion of the ECC code word.

One or more of the correction module 202, the mapping module 204, the storage module 206, and the garbage collection module 208, in certain embodiments, comprise logic hardware, such as a non-volatile memory media controller 126, an FPGA, an ASIC, or the like. Logic hardware of the correction module 202, the mapping module 204, the storage module 206, and/or the garbage collection module 208 may be configured as described above with regard to the respective modules.

FIG. 3A illustrates one embodiment of a memory element 123 comprising 3D, vertical NAND flash memory structures 300 or strings 300. The memory structures 300 or strings 300, in certain embodiments, are connected via a bit line 302 and a source line 304. The source line 304 may be used to apply a voltage to one or more memory structures 300 and sense amplifiers may use the bit lines 302 to sense current from certain storage cells 312 of a selected word line in order to determine the data stored by the cells of the selected word line. Storage cells 312 in the same location or position in different memory structures 300 on different bit lines 302, in certain embodiments, may be on the same word line. Each word line may store one page, such as single level cells 312 (SLC); two pages, such as multilevel cells 312 (MLC); three pages, such as triple level cells 312 (TLC); four pages, such as quad level cells 312 (QLC); or another number of pages.

In the depicted embodiment, a vertical, 3D NAND flash memory structure 300 comprises a "U" shaped memory structure 300. In certain embodiments, a first vertical side of the "U" shaped memory structure 300 is connected to the bit line 302 and comprises the drain side 306 of the vertical memory structure 300. In a further embodiment, a second vertical side of the "U" shaped memory structure 300 is connected to the source line 304 and comprises the source side 308 of the vertical memory structure 300. In order to write or program data to a page of a word line, a voltage may be applied to a select gate drain (SGD) 309. In order to erase data from an erase block of storage cells 312, a voltage may be applied to a select gate source (SGS) 310, which may create a potential that follows a path 314 through the vertical memory structures 300 from the source side 308 to the drain side 306.

In one embodiment, the vertical memory structures 300 may store portions of ECC code words. In certain embodiments, as described above, the correction module 202 determines an ECC code word for data and/or divides the determined ECC code word into one or more portions. The mapping module 204 may determine one or more physical addresses for the portions of the ECC code word, to place the different portions in different locations or positions relative to the memory structures 300. The mapping module 204, in certain embodiments, determines addresses so that at least one portion of an ECC code word is located in a word line on the source side 308 of memory structures 300 and so that at least one different portions of the ECC code word is located in a word line on the drain side 306 of memory structures 300 of a different memory element 123.

For example, the correction module 202 may divide an ECC code word of data into at least a first portion and a second portion. In certain embodiments, the first and second portions have the same size (e.g., comprise the same number of bits). In some embodiments, the correction module 202 divides the ECC code word into first and second portions, or more portions, of different sizes. The mapping module 204, in one embodiment, determines addresses for at least the first and second portions of the ECC code word so that a first portion is mapped to a word line comprising storage cells 312 on source sides 308 of memory structures 300 and a second portion is mapped to a word line comprising storage cells 312 of drain sides 306 of memory structures 300 of a different memory element 123. In certain embodiments, the drain side 306 word lines and associated storage cells 312 have a lower expected reliability, a higher error rate, or the like than the source side 308 word lines and associated storage cells 312. Therefore, by storing the first portion of the ECC code word of data on source side 308 storage cells 312 and the second portion of the ECC code word of data on drain side 306 storage cells 312, (e.g., and so on for N additional portions, each in different storage elements 123) a more consistent error rate or RBER may be gained for the non-volatile memory device 120.

In some embodiments, the error rate is determined based on the location of one or more word lines and associated storage cells 312 along the path of the potential 314 that is applied to the memory structures 300. For example, word lines with storage cells 312 on the source side 308 may have a lower error rate because the storage cells 312 are nearer to the SGS 310 based on a linear distance of the path of the voltage potential 314. As such, the source-side 308 storage cells 312 may have a lower voltage drift or deviation on average than the drain-side 306 storage cells 312, and may therefore be more reliable storage locations. On the other hand, word lines with storage cells 312 located on the drain side 306 may have a higher error rate because the storage cells 312 are located at a farther linear distance from the SGS 310 based on the path of the voltage potential 314. Therefore, word lines of drain-side 306 storage cells 312 may express a higher error rate because the storage cells 312 experience a higher voltage level drift or deviation and may be more susceptible to data errors.

In certain embodiments, the storage module 206, based on the determined addresses, stores the first portion of the ECC code word and the second portion of the ECC code word on different memory elements 123, in word lines with different relative positions in the memory structures 300. In some embodiments, the storage module 206 stores the ECC code word portions on different memory elements 123 so that the portions of the ECC code word may be stored or programmed in parallel, substantially simultaneously, or the like.

In some embodiments, however, the storage module 206 stores portions of the ECC code word on different word lines of storage cells 312 of the same memory element 123. In such an embodiment, the mapping module 204 determines addresses for each portion of an ECC code word that are located on the same memory element 123. For example, the mapping module 204 may determine addresses for the first portion and second portion of an ECC code word such that the portions are stored on sequential pages or word lines of a memory element 123. In such an embodiment, the mapping module 204 may determine addresses starting with word lines of storage cells 312 located on the source side 308 of the memory element 123, because the source side 308 word lines may have a lower error rate than the drain side 306 word lines 312. If, however, the mapping module 204 determines that a portion of an ECC code word is to be stored on a drain side 306 word line, the mapping module 204 may instead store the portion in a source side 308 word line of a different memory element 123, even if the drain side 306 storage cells 312 go unused. In a further embodiment, the mapping module 204 may allow a message of an ECC code word (e.g., user data, workload data) to be stored in drain side 306 storage cells 312, but may ensure that the redundant data (e.g., parity bits, ECC check bits) are stored in source side 308 storage cells 312, so that at least a portion of the drain side 306 storage cells 312 may be used.

FIG. 3B depicts one embodiment of a 3D, vertical NAND flash memory structure 320 that has an "I" shaped architecture. In such an embodiment, storage cells 312 may be located along a string 328 of the vertical memory structure 320. The string 328 may comprise various shapes, sizes, locations, or the like, within the memory structure 320. In certain embodiments, the string 328 is connected to a SGS 310 at one end and a SGD 309 at the other end. The memory structure 320 may also be connected to a bit line 302, a source line 304, and word lines as described above.

Unlike the "U" shaped vertical memory structures 300 described above with reference to FIG. 3A, where the source-side 308 storage cells 312 had lower error rates than the drain side 306 storage cells 312, the "I" shaped vertical memory structure 320 may comprise different regions, areas, bands, or the like of storage cells 312 that have different error rate rates, reliabilities, or the like, which may not necessarily be associated with a source side 308 or a drain side 306. For example, as depicted in FIG. 3B, the "I" shaped vertical memory element 123 may comprise three horizontal regions 322, 324 that have different error rate levels. Storage cells 312 of the string 328 may be located within a strong region 322 of the vertical memory structure 320 (e.g., a region that has a lower error rate than the storage cells 312 located within a weak region 324 of the vertical memory structure 320).

FIG. 3C depicts other embodiments of a 3D, vertical NAND flash memory structure 330 that has an "I" shaped architecture. The 3D, vertical NAND flash memory structure 330 of FIG. 3C may be substantially similar to the 3D, vertical NAND flash memory structure 320 of FIG. 3B. As depicted in FIG. 3C, instead of the horizontal bands, regions, areas, or the like of strong 322 and weak 324 error rates, as depicted in FIG. 3B, the "I" shaped vertical memory structures 330 of FIG. 3C depict various lines 326 dividing strong 322 or good 322 storage cells 312 from bad 322 or weak 322 storage cells 312.

In the depicted embodiments of the "I" shaped vertical memory structures 330 of FIG. 3C, word lines of storage cells 312 located along the string 328 on the right side of the dividing line 326 comprise strong word lines of storage cells 312 while word lines of storage cells 312 located along the string 328 on the left side of the dividing line 326 comprise weak word lines of storage cells 312. In other embodiments, the strong region 322 and the weak region 324 may be reversed, the string 328 may have a different shape, and/or the dividing line 326 may have a different position, depending on the architecture and characteristics of the vertical memory structures 330. FIG. 3C depicts a few, non-limiting variations, by way of example, illustrating certain embodiments of how the strong region 322 and the weak region 324 may be disposed based on different dividing lines 326.

As with the "U" shaped vertical memory structures 300 of FIG. 3A, the correction module 202 may determine an ECC code word for data and may divide the ECC code word into one or more portions. The mapping module 204 may determine an address for a first portion of the ECC code word, the address comprising a storage location within the strong regions 322 of a set of vertical memory structures 330. Further, the mapping module 204 may determine an address for a second portion of the ECC code word, the address comprising a storage location within the weak regions 324 of a different set of vertical memory structures 330 in a different memory element 123. In this manner, the ECC storage module 150 may achieve a more even, consistent error rate across an entire non-volatile storage device 120.

FIG. 4A depicts one embodiment of a storage channel 400 for distributing storage of ECC code words within a "U" shaped 3D, vertical NAND memory structure 300. In one embodiment, a plurality of die 123 (e.g., two die 123, in the depicted embodiment, for simplicity) may be tied together, connected, coupled, or the like (e.g., with one or more common control lines, enable lines, or the like) to form a single paired storage channel 400. In such an embodiment, a source side word line 402 of a first memory element 123 is matched 406 with a corresponding drain side word line 404 of a different memory element 123, so that each stores a different portion of the same ECC code word. Thus, in certain embodiments, the mapping module 204 may map an address for a first portion of an ECC code word to the source side word line 402 of the first die 123 and the mapping module 204 may map an address for a second portion of the ECC code word to the drain side word line 404 of the second die 123.

Similar to FIG. 4A, FIG. 4B depicts an embodiment of a storage channel 410 for distributing storage of ECC code words within a "U" shaped 3D, vertical NAND memory structure 300. Like the storage channel 400 depicted in FIG. 4A, a plurality of die 123 may be tied together, connected, coupled, or the like to form a single paired storage channel 410. In FIG. 4A, an excess source side word line 402 and an excess drain side word line 404 have gone unused, in order to enforce a page programming order or the like. The storage channel 410 depicted in FIG. 4B, however, shows that an unpaired source side word line 412 of a first die 123 may be matched 416 with an unpaired drain side 414 by wrapping around to the beginning of the storage channel 410, even if pages or word lines may be programmed out of sequential order. In this manner, unlike the storage channel 400 of FIG. 4A, each source side word line 412 may be paired or matched with a corresponding drain side word line 414 to complete the storage channel 410 and utilize each possible storage location, word line, storage cell, or the like of the storage channel 410, in embodiments where pages or word lines may be programmed out of order.

Figure 5:
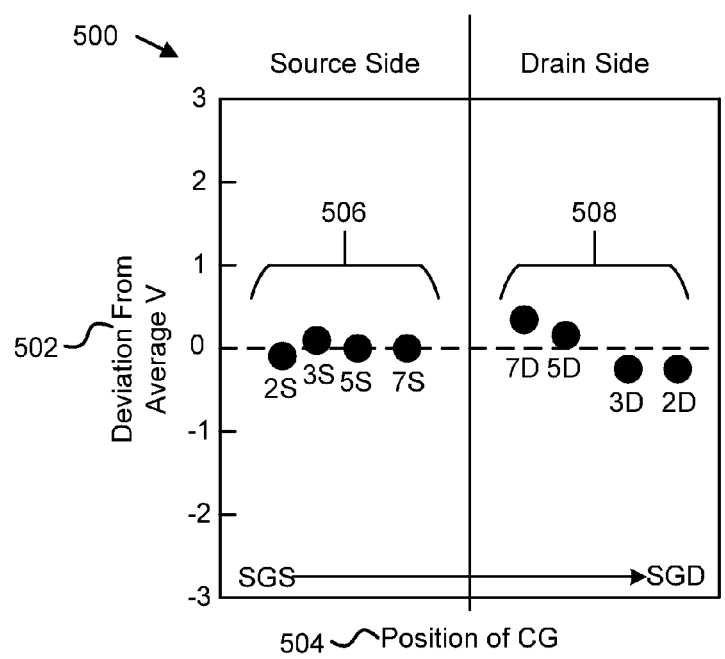
FIG. 5 illustrates one embodiment of voltage distributions for a memory element.

FIG. 5 is illustrates one embodiment of voltage distributions 500 for a 3D, vertical NAND memory structure 300. As depicted in FIG. 5, the chart shows the deviation from an average voltage along the y-axis 502 and a position of a storage cell (e.g., a control gate) along the x-axis 504. In particular, the chart depicts voltage deviations for a sample of storage cells 506 located on a source side of a "U" shaped, vertical memory structure 300 and storage cells 508 located on a drain side of a "U" shaped, vertical memory structure 300.

In certain embodiments, a greater deviation from the average voltage 502 implies that a storage cell has a higher error rate, and, consequently, may have a lower reliability. For example, as illustrated in FIG. 5, voltage deviations for the sample of storage cells 506 for a source side of a vertical memory structure 300 may be less than the voltage deviations for the sample of storage cells 508 for a drain side of a vertical memory structure 300. Thus, data stored on a drain side of a vertical memory structure 300 may be lost, distorted, or otherwise changed due to the unreliability of or errors in the drain side storage cells, as determined by the measured deviations from the average voltage 502. The ECC storage module 150, however, may amortize or level these errors by storing a portion of an ECC code word on source side storage cells 506 and a portion on drain side storage cells 508, which may level or even out the error rates for a non-volatile storage device 120.

Figure 6:
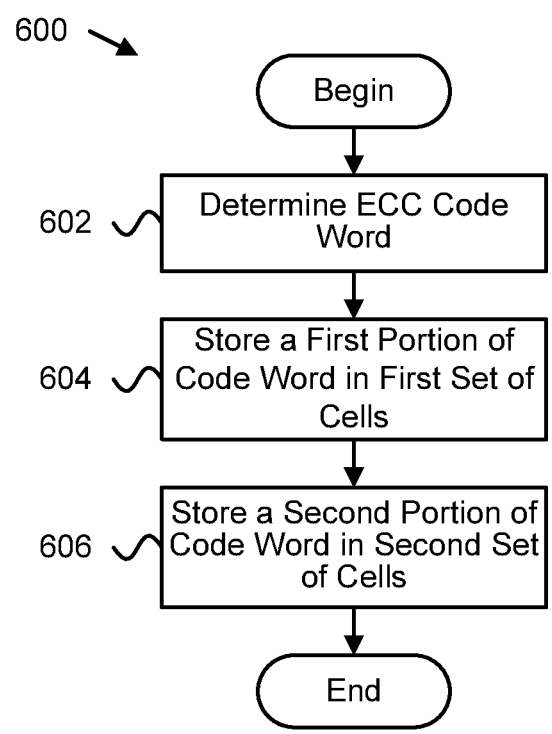
FIG. 6 is a schematic flow chart diagram illustrating a one embodiment of a method for distributing storage of ECC code words.

FIG. 6 depicts one embodiment of a method 600 for distributing storage of ECC code words. In one embodiment, the method 600 begins and the correction module 202 determines 602 an ECC code word of data. In certain embodiments, the storage module 206 stores 604 a first portion of the ECC code word in a first set of cells of a first memory element 123 of a non-volatile recording device 120. In a further embodiment, the storage module 206 stores 606 a second portion of the ECC code word in a second set of cells of a second memory element 123 of the non-volatile recording device 120 and the method 600 ends. In some embodiments, the second set of cells has a different error rate than the first set of cells, a different physical address than the first set of cells, a different relative location or position than the first set of cells, or the like.

Figure 7:
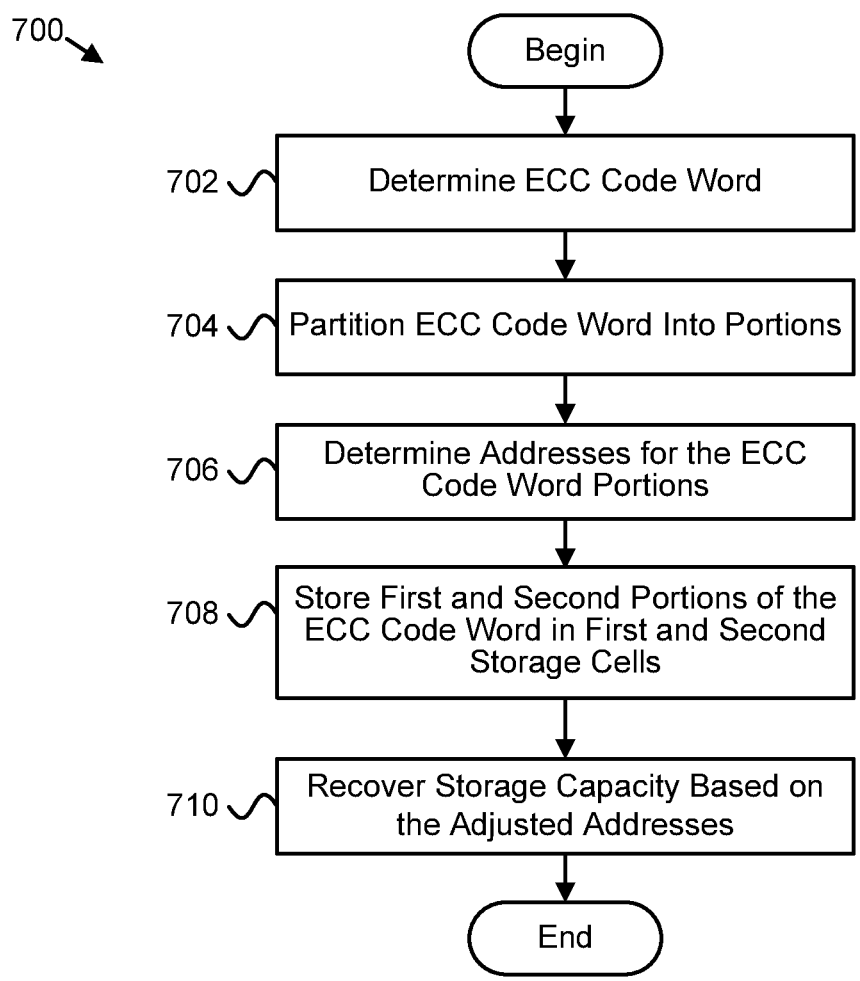
FIG. 7 is a schematic flow chart diagram illustrating a further embodiment of a method for distributing storage of ECC code words.

FIG. 7 depicts another embodiment of a method 700 for distributing error-correction codes. In one embodiment, the method 700 begins and the correction module 202 determines 702 an ECC code word of data and partitions, splits, or otherwise divides 704 the ECC code word into one or more portions or segments. The mapping module 204, in certain embodiments, determines 706 one or more addresses for the one or more portions of the ECC code word.

In certain embodiments, the mapping module 204 determines 706 one or more addresses that correspond to physical locations within a 3D, vertical memory structure 300, 320, 330. For example, the mapping module 204 may determine 706 an address for a first portion of an ECC code word that corresponds to a storage location on a source side 308 of "U" shaped vertical memory structures 300, in a strong region 322 or good region of "I" shaped vertical memory structures 320, 330, or the like. The mapping module 204 may also determine 706 an address for a second portion of the ECC code word that corresponds to a storage location on a drain side 306 of "U" shaped vertical memory structures 300, in a weak region 324 or bad region of "I" shaped vertical memory structures 320, 330, or the like of a different memory element 123.

In one embodiment, the storage module 206 stores 708 portions of the ECC code word in different memory elements 123. Thus, in the previous example, the storage module 206 may store the first portion of the ECC code word in a first set of cells of a first memory element 123 and the second portion of the ECC code word in a second set of cells of a second memory element 123. In an example where the memory element 123 comprises "U" shaped vertical memory structures 300, the storage module 206 may store the first portion at an address corresponding to source-side 308 storage cells 312 of a first memory element 123 and the second portion at an address corresponding to drain-side 306 storage cells 312 of a second memory element 123.

In some embodiments, the source-side 308 storage cells 312 comprise a lower error rate than the drain-side 306 storage cells 312. In one embodiment, the storage module 206 stores the first portion of the ECC code word within source-side 308 storage cells 312 on a different memory element 123 than the second portion of the ECC code word. The storage module 206 may store portions of the ECC code word in vertical memory structures 300, 320, 330 that have various regions, areas, bands, portions, or the like of storage cells 312 that have different error rates such that the storage module 206 stores a first portion of the ECC code word in a storage location that has a lower error rate than a storage location where the second portion of the ECC code word is stored.

In certain embodiments, the garbage collection module 208 recovers 710 storage capacity for an erase block comprising either a first set of storage cells 312 or a second set of storage cells 312 that each store a portion of the same ECC code word, in response to recovering storage capacity for an erase block comprising the other of the first set of storage cells 312 and the second set of storage cells 312. For example, the garbage collection module 208 may erase a portion of an ECC code word that is stored on a source-side 308 word line in response to the garbage collection module 208 erasing a corresponding portion of the ECC code word from a drain-side 306 word line, and copying the code word to a new location, and the method 700 ends.

A means for determining an ECC code word of data, in various embodiments, may include a correction module 202, an ECC storage module 150, a non-volatile memory controller 124, a non-volatile memory media controller 126, an SML 130, a device driver, a hardware ECC encoder, a software ECC encoder, other logic hardware, and/or other executable code stored on a computer readable storage medium. Other embodiments may include similar or equivalent means for determining an ECC code word of data.

A means for determining one or more addresses for an ECC code word of data, in various embodiments, may include a mapping module 204, an ECC storage module 150, a non-volatile memory controller 124, a non-volatile memory media controller 126, an SML 130, a device driver, other logic hardware, and/or other executable code stored on a computer readable storage medium. Other embodiments may include similar or equivalent means for determining one or more addresses for an ECC code word of data.

A means for storing an ECC code word of data, in various embodiments, may include a storage module 206, an ECC storage module 150, a non-volatile memory controller 124, a non-volatile memory media controller 126, an SML 130, a device driver, other logic hardware, and/or other executable code stored on a computer readable storage medium. Other embodiments may include similar or equivalent means for storing an ECC code word of data.

A means for recovering storage capacity for an erase block, in various embodiments, may include a garbage collection module 208, an ECC storage module 150, a non-volatile memory controller 124, a non-volatile memory media controller 126, an SML 130, a device driver, a groomer, other logic hardware, and/or other executable code stored on a computer readable storage medium. Other embodiments may include similar or equivalent means for recovering storage capacity for an erase block.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:

1. A method comprising:
   determining, by a controller for a non-volatile recording device, an error-correction code (ECC) code word of data;
   storing, by the controller, a first portion of the ECC code word in a first set of cells of a first memory element of the non-volatile recording device, the first set of cells located on a source side of a vertical memory structure of the first memory element; and
   storing, by the controller, a second portion of the ECC code word that corresponds to the first portion of the ECC code word in a second set of cells of a second memory element of the non-volatile recording device, the second set of cells having a different error rate than the first set of cells, the second set of cells located on a drain side of a vertical memory structure of the second memory element.

2. The method of claim 1, wherein the first set of cells is located at a first position in one or more vertical memory structures and the second set of cells is located at a different position in one or more different vertical memory structures.

3. The method of claim 2, wherein the vertical memory structures comprise three dimensional, vertical, NAND memory structures.

4. The method of claim 1, wherein redundant data for the ECC code word is stored in the first set of cells on the source side of the one or more vertical memory structures.

5. The method of claim 2, wherein the first set of cells has a shorter path to a select gate source for the first set of cells than the second set of cells has to a select gate source for the second set of cells.

6. The method of claim 1, further comprising mapping, by the controller, an address for the second portion of the ECC code word to the second set of cells, the second set of cells having a different location relative to the second memory element than a location of the first set of cells relative to the first memory element.

7. The method of claim 1, wherein the first set of cells and the second set of cells are located on different die of the non-volatile recording device.

8. The method of claim 1, further comprising recovering, by the controller, storage capacity for an erase block comprising one of the first set of cells and the second set of cells in response to recovering storage capacity for an erase block comprising the other of the first set of cells and the second set of cells.

9. The method of claim 1, further comprising dividing, by the controller, the ECC code word into a number of portions including the first portion and the second portion, the number of portions corresponding to a number of die in a storage channel of the non-volatile recording device.

10. The method of claim 1, wherein a larger portion of the ECC code word is stored in the first set of cells, the first set of cells having a lower error rate than the second set of cells.

11. An apparatus comprising:
    a correction module configured to determine an error correction code (ECC) code word for storage on one or more non-volatile storage media;
    a mapping module configured to determine one or more addresses for the ECC code word so that a portion of the ECC code word is stored at a first physical address within a first set of strings of storage cells of the one or more non-volatile storage media, the first physical address located on a source side of a vertical memory structure of a first memory element, and a portion of the ECC code word is stored at a different physical address within a second set of strings of storage cells of the one or more non-volatile storage media, the different physical address having a different error rate than the first physical address, the different physical address located on a drain side of a vertical memory structure of a second memory element; and
    a storage module configured to cause the ECC code word to be stored in the one or more non-volatile storage media based on the determined one or more addresses.

12. The apparatus of claim 11, wherein the first set of strings of storage cells are located on a first set of one or more die of the one or more non-volatile storage media and the second set of strings of are located on a second set of one or more die of the one or more non-volatile storage media.

13. The apparatus of claim 11, wherein one or more of the correction module, the mapping module, and the storage module comprise computer executable code of a device driver for the one or more non-volatile storage media, the computer executable code stored on a computer readable storage medium.

14. The apparatus of claim 13, wherein computer executable code of the correction module is executable to perform operations to determine the ECC code word of data by encoding data into the ECC code word and computer executable code of the mapping module is executable to determine the one or more addresses for the ECC code word by adjusting one or more addresses for the ECC code word so that a portion of the ECC code word is stored in the first set of strings of storage cells and a portion of the ECC code word is stored in the second set of strings of storage cells.

15. The apparatus of claim 11, wherein one or more of the correction module, the mapping module, and the storage module comprise logic hardware of a controller for the one or more non-volatile storage media.

16. The apparatus of claim 15, wherein the correction module is configured to determine the ECC code word of data by receiving the ECC code word at the controller from a host device and the mapping module is configured to determine the one or more addresses for the ECC code word by receiving the one or more addresses at the controller from the host device.

17. A system comprising:
   a plurality of die, each die comprising a plurality of vertical NAND flash memory structures comprising word lines, wherein each of the plurality of vertical NAND flash memory structures includes a plurality of cells along a length of a vertical string; and
   a controller for the plurality of die, the controller configured to store part of an error-correction code (ECC) code word in cells having a first position in a word line of a first die of the plurality of die, the cells having the first position located on a source side of a vertical NAND flash memory structure of the first die, and to store part of the ECC code word in cells having a second position in a word line of a second die of the plurality of die, the cells having the second position having a different error rate than the cells having the first position, the cells having the second position located on a drain side of a vertical NAND flash memory structure of the second die.

18. The system of claim 17, wherein the controller comprises a hardware controller in communication with the plurality of die over one or more electrical communication lines to store the ECC code word.

19. The system of claim 17, wherein the controller comprises a device driver for the plurality of die, the device driver comprising computer executable program code stored on a computer readable storage medium, the computer executable program code executable to store the ECC code word.

* * * * *